(12) United States Patent
Ikegawa et al.

(10) Patent No.: US 11,264,564 B2
(45) Date of Patent: Mar. 1, 2022

(54) MAGNETORESISTIVE DEVICES AND METHODS THEREFOR

(71) Applicant: Everspin Technologies, Inc., Chandler, AZ (US)

(72) Inventors: Sumio Ikegawa, Phoenix, AZ (US); Hamid Almasi, Chandler, AZ (US); Shimon, Singapore (SG); Kerry Nagel, Scottsdale, AZ (US); Han Kyu Lee, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 120 days.

(21) Appl. No.: 16/783,740

(22) Filed: Feb. 6, 2020

(65) Prior Publication Data
US 2021/0249589 A1 Aug. 12, 2021

(51) Int. Cl.
H01L 43/08 (2006.01)
H01L 43/02 (2006.01)
H01L 43/10 (2006.01)

(52) U.S. Cl.
CPC .............. H01L 43/08 (2013.01); H01L 43/02 (2013.01); H01L 43/10 (2013.01)

(58) Field of Classification Search
CPC .......... H01L 43/08; H01L 43/02; H01L 43/10
USPC ........................................................ 257/421
See application file for complete search history.

(56) References Cited

U.S. PATENT DOCUMENTS

| 2014/0056060 A1 | 2/2014 | Khvalkovskiy et al. | |
| 2014/0211552 A1* | 7/2014 | Pi | G11C 11/18 365/158 |
| 2014/0269035 A1* | 9/2014 | Manipatruni | G11C 11/18 365/158 |
| 2017/0040529 A1 | 2/2017 | Pi et al. | |
| 2018/0174634 A1* | 6/2018 | Kato | G11C 11/1659 |
| 2018/0190899 A1 | 7/2018 | Kim et al. | |
| 2018/0190902 A1 | 7/2018 | Garello et al. | |
| 2019/0115060 A1* | 4/2019 | Deshpande | G11C 11/1673 |
| 2020/0035909 A1* | 1/2020 | Sun | G11C 11/1673 |

(Continued)

FOREIGN PATENT DOCUMENTS

| EP | 3591701 A1 | 1/2020 |
| WO | WO 2019/167575 A1 | 9/2019 |

OTHER PUBLICATIONS

International Search Report and Written Opinion in International Application No. PCT/US2021/016144, dated May 4, 2021 (18 pages).

*Primary Examiner* — Jami Valentine Miller
(74) *Attorney, Agent, or Firm* — Bookoff McAndrews, PLLC

(57) ABSTRACT

A magnetoresistive device may include one or more electrodes or electrically conductive lines and a fixed region and a free region disposed between the electrodes or electrically conductive lines. The fixed region may have a fixed magnetic state and the free region may be configured to have a first magnetic state and a second magnetic state. The free region may store a first value when in the first magnetic state and store a second value when in the second magnetic state. The magnetoresistive device may further include a dielectric layer between the free region and the fixed region and a spin-Hall (SH) material proximate to at least a portion of the free region. An insertion layer may be disposed between the SH material and the free region.

20 Claims, 11 Drawing Sheets

(56) References Cited

U.S. PATENT DOCUMENTS

2020/0136017 A1\* 4/2020 Ashida .................... H01F 41/32
2021/0249589 A1\* 8/2021 Ikegawa ................. H01L 43/02

\* cited by examiner

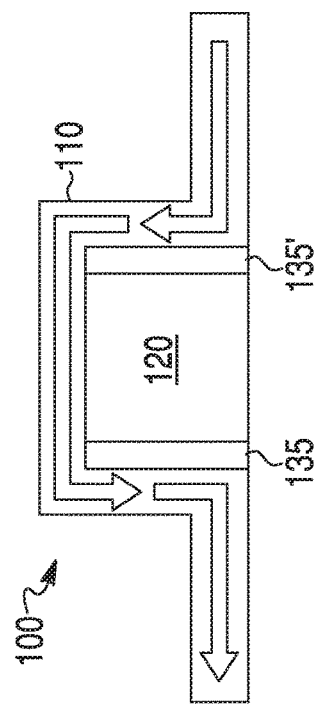
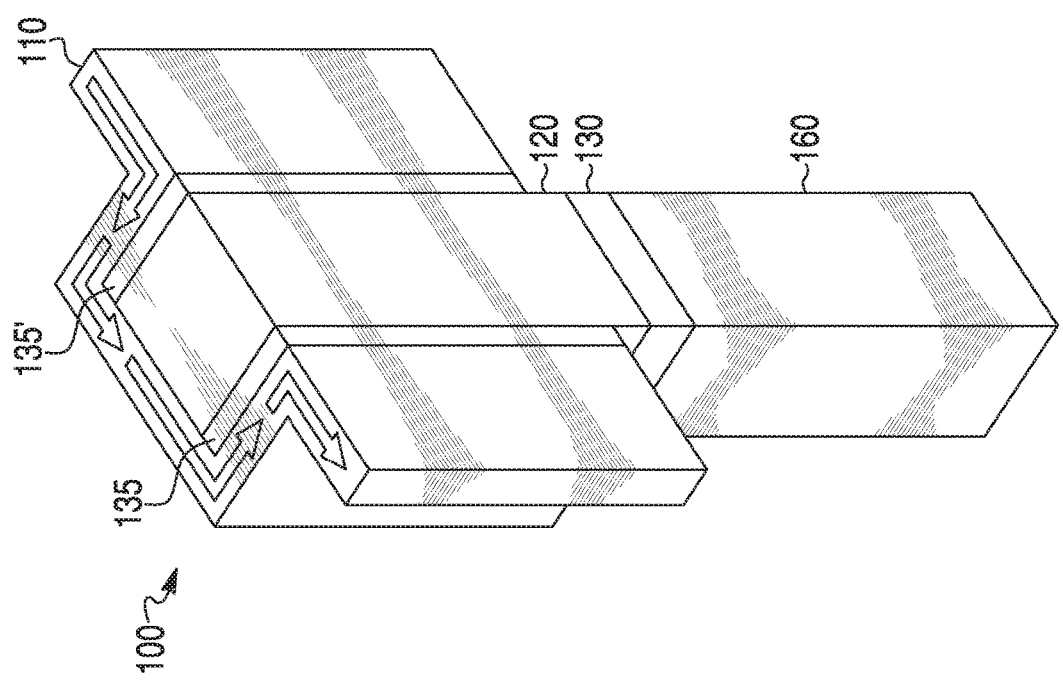
FIG. 2B
FIG. 2A

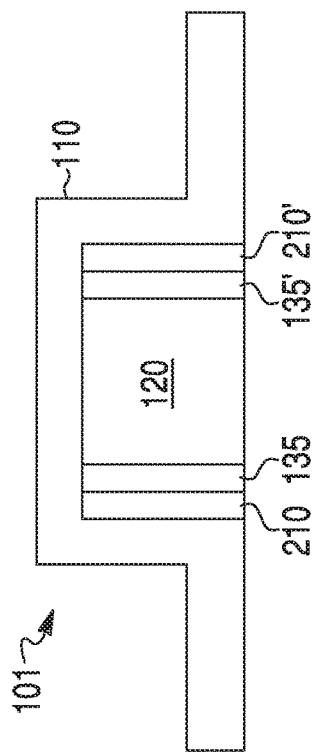
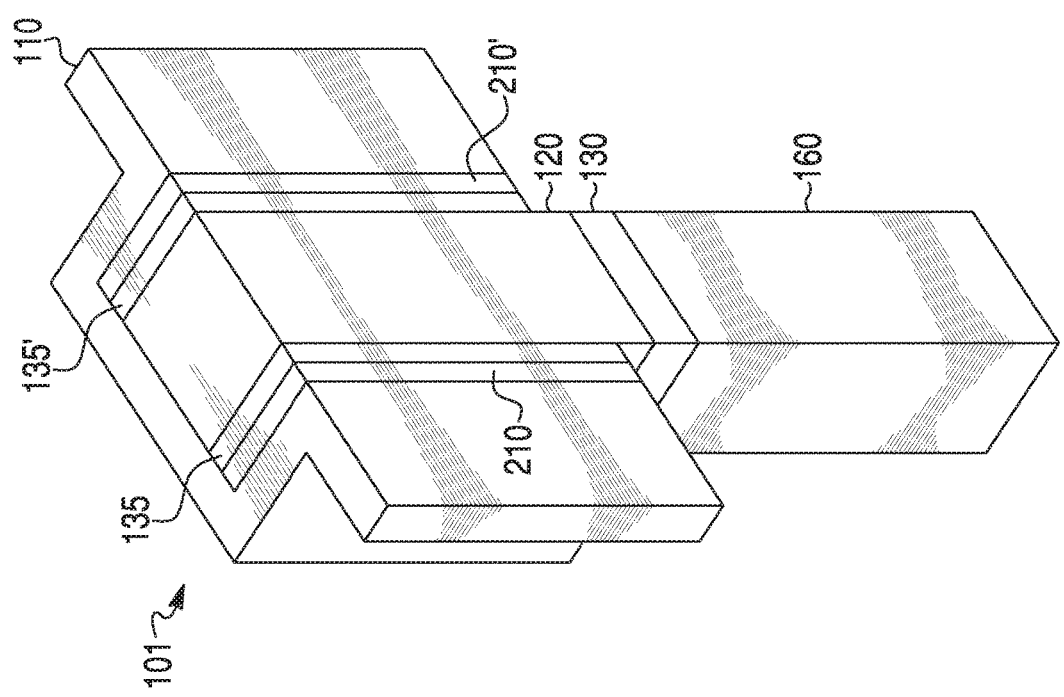

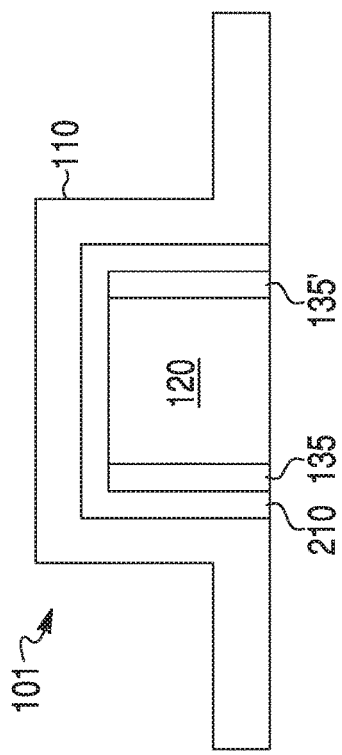
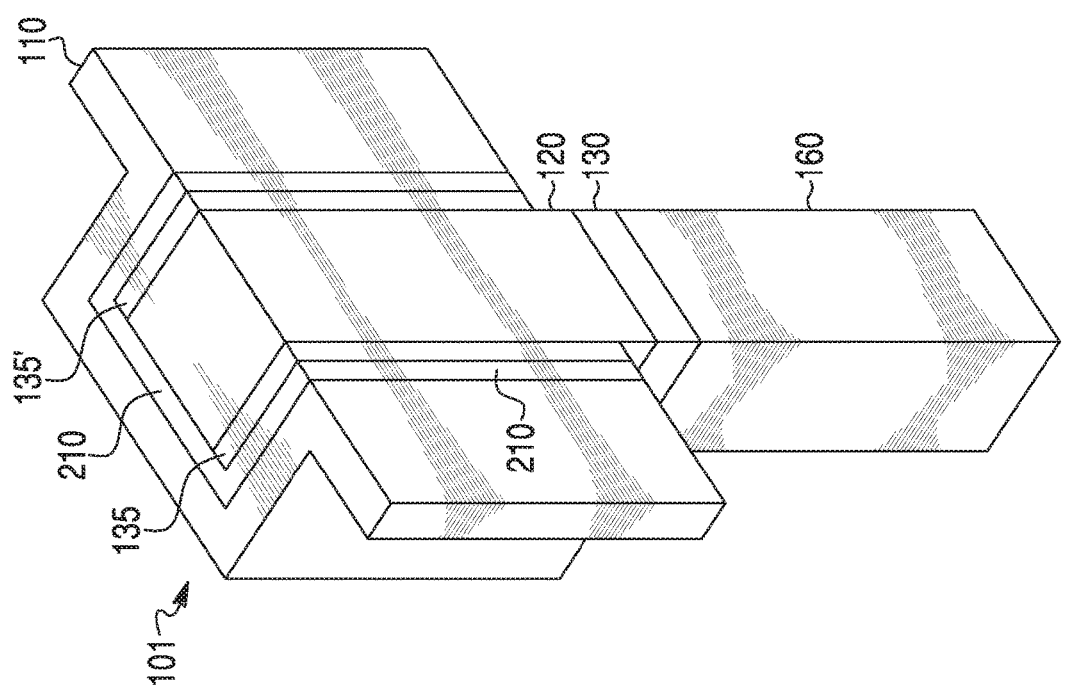

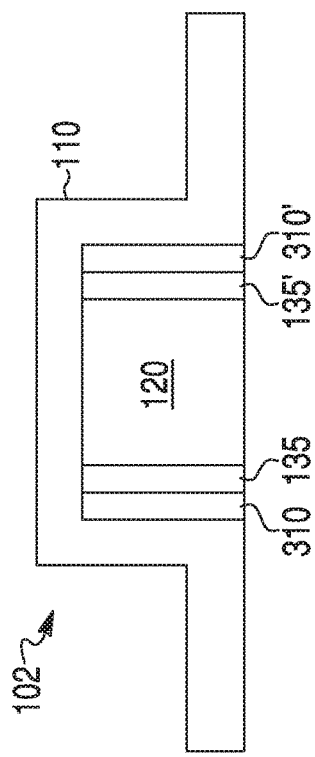
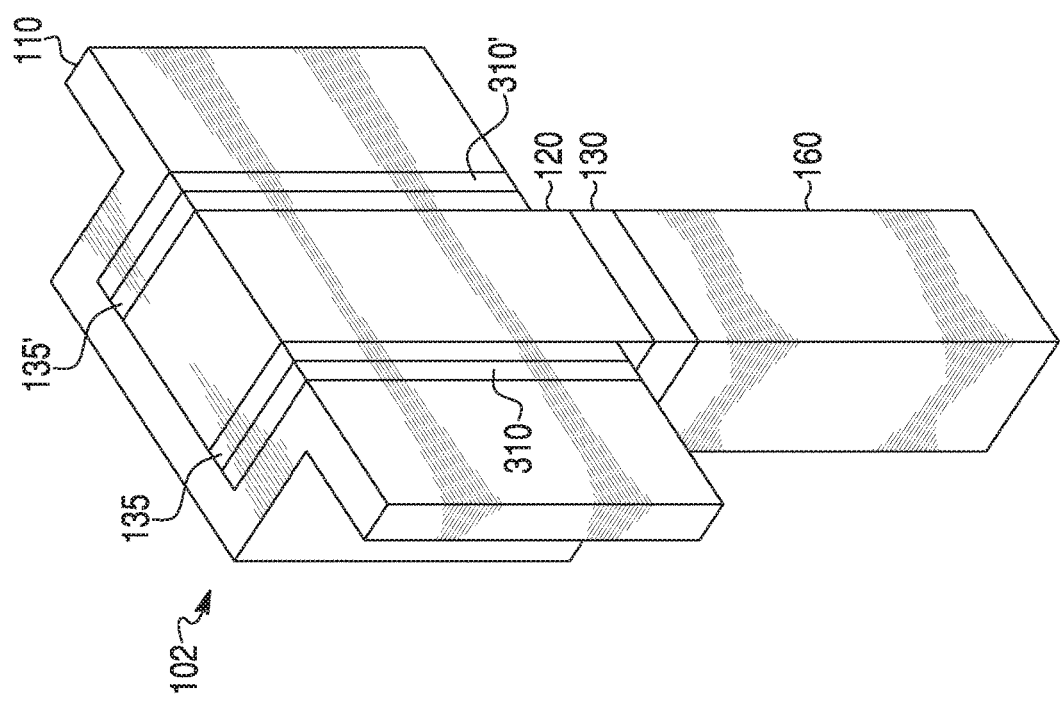

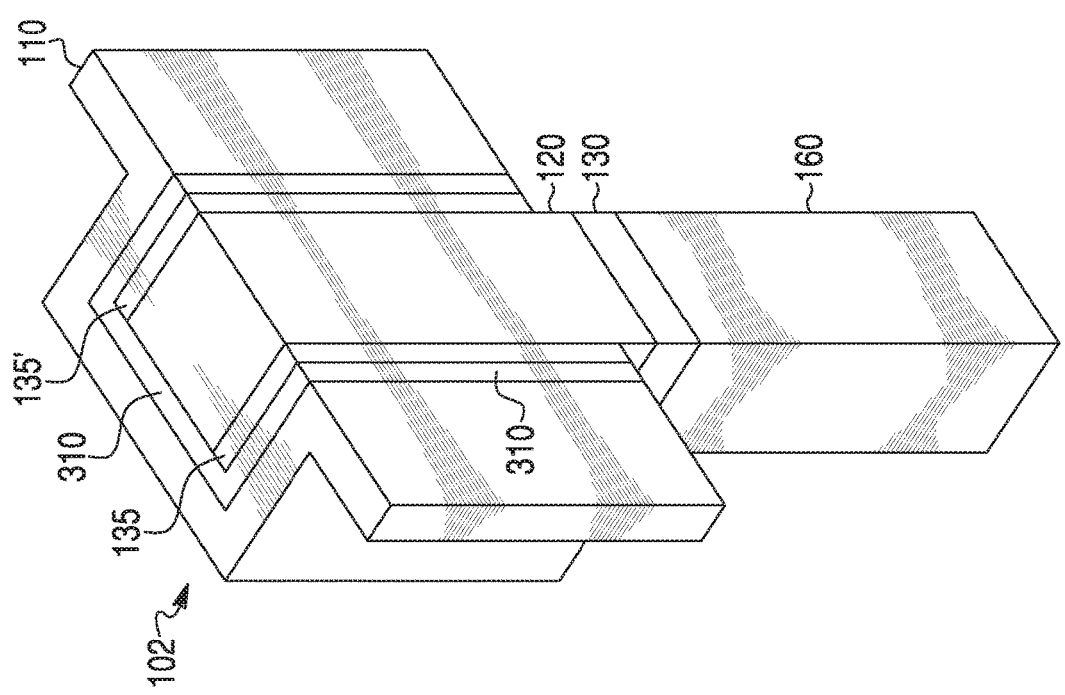
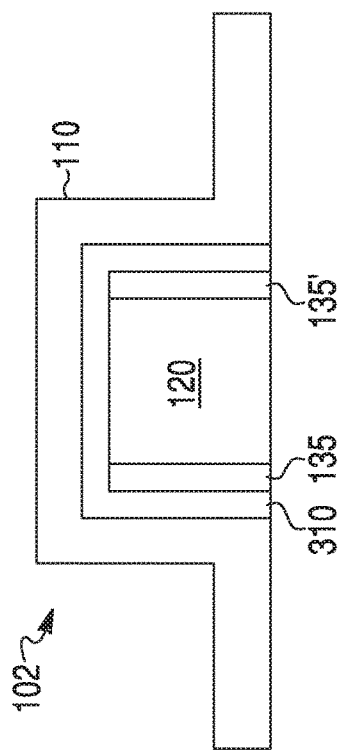

FIG. 8
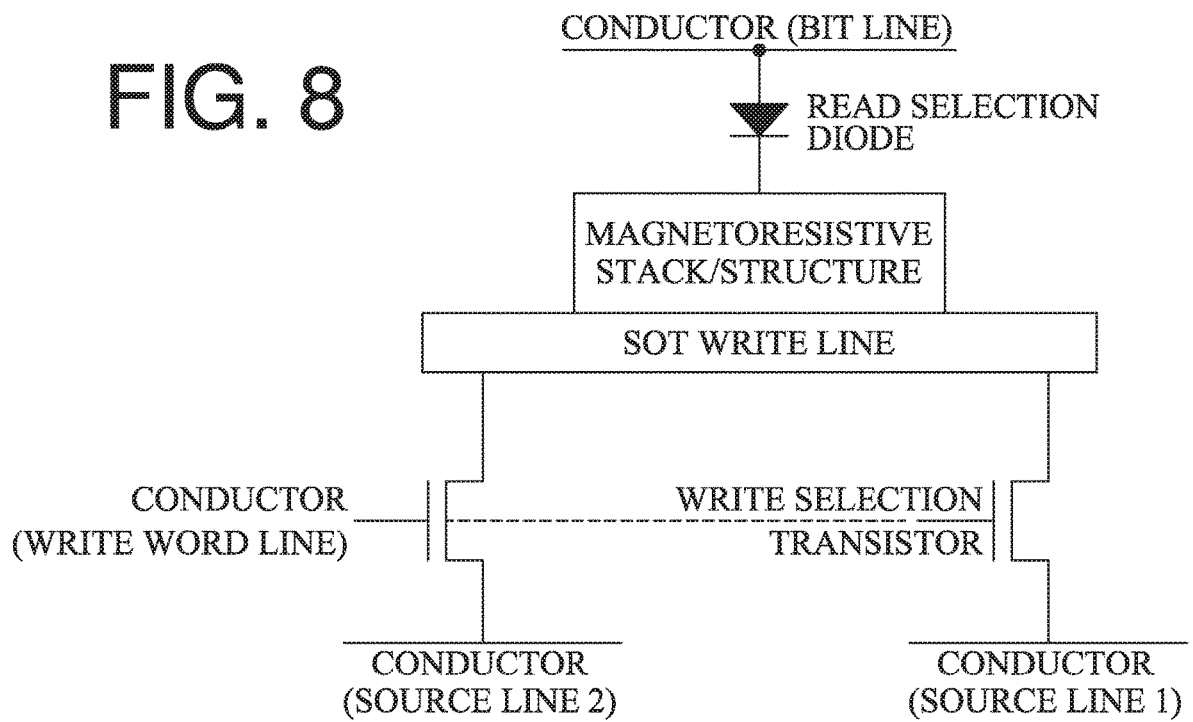
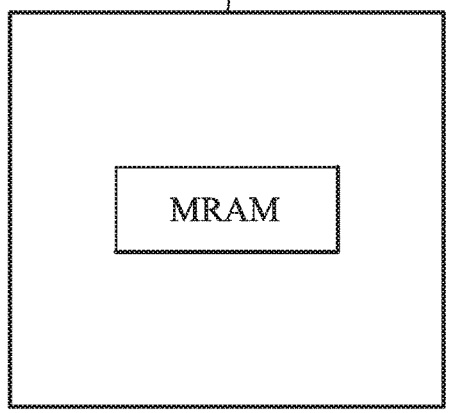
FIG. 9
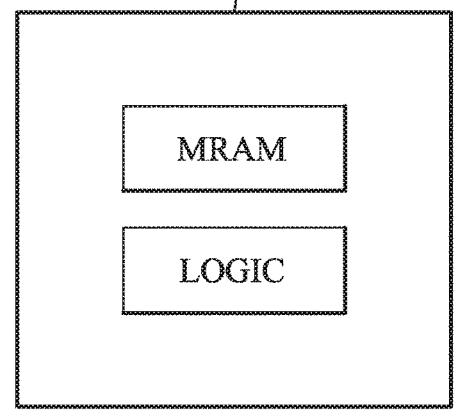
FIG. 10

MAGNETORESISTIVE DEVICES AND METHODS THEREFOR

TECHNICAL FIELD

The present disclosure relates to, among other things, magnetoresistive devices and methods for fabricating and/or using the disclosed magnetoresistive devices.

INTRODUCTION

In one or more embodiments, the present disclosure relates to a magnetoresistive device having a magnetoresistive stack or structure (for example, part of a magnetoresistive memory device and/or magnetoresistive sensor/transducer device) and methods of manufacturing and operating the described magnetoresistive devices. In one embodiment, an exemplary magnetoresistive stack (for example, used in a magnetic tunnel junction (MTJ) magnetoresistive device) of the present disclosure includes one or more layers of magnetic or ferromagnetic material.

Briefly, a magnetoresistive stack used in a memory device (e.g., a magnetoresistive random access memory (MRAM)) of the present disclosure includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information is stored in the magnetoresistive memory stack by switching, programming, and/or controlling the direction of magnetization vectors in the magnetic layer(s) of the free magnetic region. The direction of the magnetization vectors of the free magnetic region may be switched and/or programmed (for example, through spin-orbit torque (SOT) and/or spin-transfer torque (STT)) by application of a write signal (e.g., one or more charge current pulses) adjacent to, or through, the magnetoresistive memory stack. In contrast, the magnetization vectors in the magnetic layers of a fixed magnetic region are magnetically fixed in a predetermined direction during application of the write signal. When the magnetization vectors of the free magnetic region adjacent to the non-magnetic layer are in the same direction as the magnetization vectors of the fixed magnetic region adjacent to the non-magnetic layer, the magnetoresistive memory stack has a first magnetic state. Conversely, when the magnetization vectors of the free magnetic region adjacent to the non-magnetic layer are opposite the direction of the magnetization vectors of the fixed magnetic region adjacent to the non-magnetic layer, the magnetoresistive memory stack has a second magnetic state. The magnetoresistive memory stack has different electrical resistances in the first and second magnetic states. For example, a resistance (e.g., electrical) of the second magnetic state may be relatively higher than a resistance of the first magnetic state. The magnetic state of the magnetoresistive memory stack is determined or read based on the resistance of the stack in response to a read current (e.g., a charge current) applied, for example, through the magnetoresistive stack.

As magnetic memory devices (e.g., MRAM) advance towards smaller process nodes to increase density, individual MTJ bit sizes must laterally shrink to accommodate tighter pitch and space between bits. However, as the size and/or aspect ratio of the MTJ bit decreases, the energy barrier between the two magnetic states of the MTJ bit may decrease. As the energy barrier decreases, however, the data retention and/or thermal stability of the MTJ bit also may decrease. Typically, the decrease in energy barrier of the MTJ bit may be corrected by increasing the perpendicular anisotropy or magnetic moment of the free region by altering its composition/material/thickness. However, doing so also may raise the critical current (described in greater detail below) of the MTJ bit. MTJ bits with high critical currents undergo a greater amount of periodic damage and degeneration during write and/or reset operations and negatively impact MTJ device (i.e. MRAM) endurance.

The present disclosure relates to devices (e.g., devices including magnetoresistive stacks) and methods for writing or otherwise switching the magnetic state of a magnetoresistive memory device via STT and/or SOT switching schemes. More particularly, the description that follows describes embodiments of MTJ geometries which integrate SOT and/or STT switching mechanics, individually or in combination, to provide improved switching efficiency, enabling the switching of a high energy barrier MTJ bit without the use of unnecessary high magnitudes of write current. The scope of the current disclosure, however, is defined by the attached claims, and not by any characteristics of the resulting devices or methods.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. The drawings are simplifications provided to help illustrate the relative positioning of various regions/layers and describe various processing steps. One skilled in the art would appreciate that the regions are not necessarily drawn to scale and should not be viewed as representing proportional relationships between different regions/layers. Moreover, while certain regions/layers and features are illustrated with straight 90-degree edges, in actuality or practice such regions/layers may be more "rounded", curved, and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 1B:
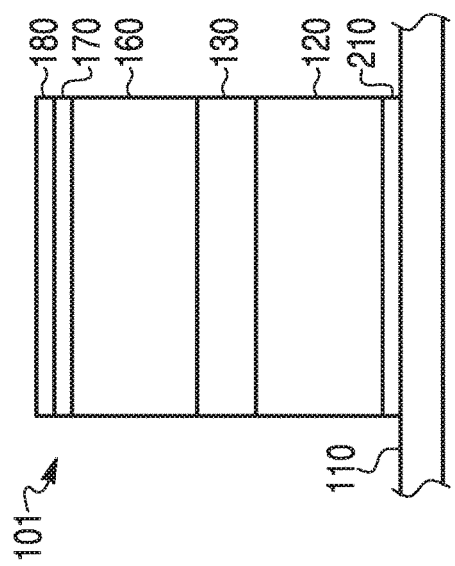
Figure 1A:
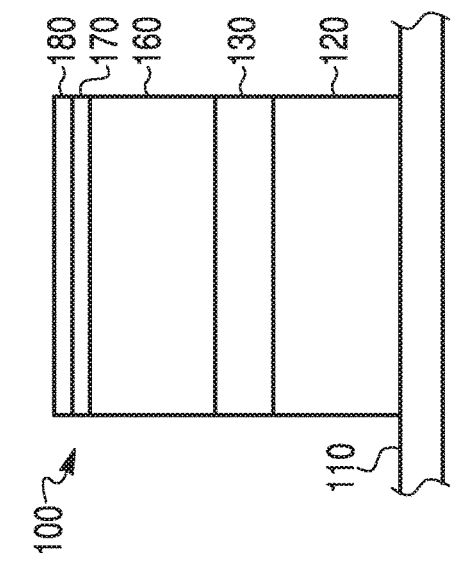
Figure 1C:
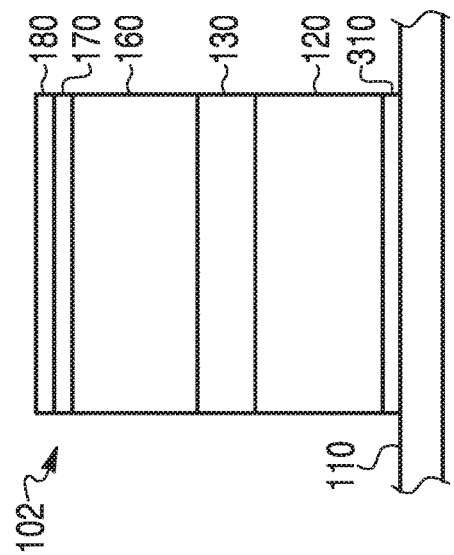

FIGS. 1A-1C each illustrate a schematic diagram of a region of a magnetoresistive stack utilizing SOT and/or STT switching mechanisms, according to one or more embodiments of the present disclosure;

FIG. 2A illustrates a schematic diagram of a region of a magnetoresistive stack utilizing SOT and/or STT switching mechanisms, according to one or more embodiments of the present disclosure;

FIG. 2B illustrates a top-down view depicting the magnetoresistive stack shown in FIG. 2A, according to one or more embodiments of the present disclosure;

FIG. 3A illustrates a schematic diagram of a region of a magnetoresistive stack utilizing SOT and/or STT switching mechanisms, according to one or more embodiments of the present disclosure;

FIG. 3B illustrates a top-down view depicting the magnetoresistive stack shown in FIG. 3A, according to one or more embodiments of the present disclosure;

FIG. 4A illustrates a schematic diagram of a region of a magnetoresistive stack utilizing SOT and/or STT switching mechanisms, according to one or more embodiments of the present disclosure;

FIG. 4B illustrates a top-down view depicting the magnetoresistive stack shown in FIG. 4A, according to one or more embodiments of the present disclosure;

FIG. 5A illustrates a schematic diagram of a region of a magnetoresistive stack utilizing SOT and/or STT switching mechanisms, according to one or more embodiments of the present disclosure;

FIG. 5B illustrates a top-down view depicting the magnetoresistive stack shown in FIG. 5A, according to one or more embodiments of the present disclosure;

FIG. 6A illustrates a schematic diagram of a region of a magnetoresistive stack utilizing SOT and/or STT switching mechanisms, according to one or more embodiments of the present disclosure;

FIG. 6B illustrates a top-down view depicting the magnetoresistive stack shown in FIG. 6A, according to one or more embodiments of the present disclosure;

FIGS. 7A-7D are flow charts illustrating one or more exemplary processes for manufacturing a magnetoresistive stack utilizing SOT and/or STT switching mechanisms;

FIG. 8 is a schematic diagram of an exemplary magnetoresistive memory stack electrically connected to a select device, e.g., an access transistor, in a magnetoresistive memory cell configuration;

FIGS. 9 and 10 are schematic block diagrams of integrated circuits including a discrete memory device and an embedded memory device, each including an MRAM (which, in one embodiments is representative of one or more arrays of MRAM having a plurality of magnetoresistive memory stacks according to aspects of certain embodiments of the present disclosure).

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

It should further be noted that, although exemplary embodiments are described in the context of MTJ stacks/structures, the present inventions may also be implemented in connection with giant magnetoresistive (GMR) stacks/structures where a conductor (e.g., a layer of copper) is disposed between two ferromagnetic regions/layers/materials. Embodiments of the present disclosure may be employed in connection with other types of magnetoresistive stacks/structures where such stacks/structures include a fixed magnetic region. For the sake of brevity, the discussions and illustrations presented in this disclosure will not be repeated specifically in the context of GMR or other magnetoresistive stacks/structures (e.g., anisotropic magnetoresistive (AMR) devices), but the discussion and drawings described below are to be interpreted as being entirely applicable to GMR and other magnetoresistive stacks/structures (e.g., AMR-type devices).

In this disclosure, the term "region" may be used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive devices may be referred to by specific names (e.g., bottom electrode, top electrode, fixed magnetic region, free magnetic region), this is only for ease of description and not intended as a functional description or relative location/orientation of the layer. Moreover, although the description below and the figures appear to depict a certain orientation of the layers relative to each other, those of ordinary skill in the art will understand that such descriptions and depictions are only exemplary. For example, though a free region of a magnetoresistive stack may be depicted as being "above" an intermediate layer of that stack, in some aspects the entire depicted magnetoresistive stack may be flipped such that the free region is "below" the intermediate layer.

In one exemplary embodiment, a magnetoresistive stack of a magnetoresistive device of the present disclosure may be implemented as a STT and/or SOT MRAM element. In such embodiments, the magnetoresistive stack may include an intermediate layer disposed (e.g., sandwiched) between two ferromagnetic regions to form an MTJ device or an MTJ-type device. Of the two ferromagnetic regions disposed on either side of the intermediate layer, one ferromagnetic region may be a fixed (or pinned) magnetic region, and the other ferromagnetic region may be a free magnetic region. The term free is intended to refer to ferromagnetic regions having a magnetic moment that may shift or move significantly in response to applied magnetic fields or spin-polarized currents used to switch the magnetic moment vector. Relatedly, the words fixed or "pinned" are used to refer to ferromagnetic regions having a magnetic moment vector that does not move substantially in response to such applied magnetic fields or spin-polarized currents. As is known in the art, an electrical resistance of the described magnetoresistive stack may change based on whether the magnetization direction (e.g., the direction of the magnetic moment) of the free region adjacent to the non-magnetic layer (e.g., a tunnel barrier) is in parallel alignment or in an antiparallel alignment with the magnetization direction (e.g., the direction of the magnetic moment) of the fixed region adjacent to the non-magnetic layer. Typically, if the two regions have the same magnetization alignment, the resulting relatively low resistance is considered as a digital "0," while if the alignment is antiparallel the resulting relatively higher resistance is considered to be a digital "1." A memory device (e.g., an MRAM) may include multiple magnetoresistive stacks, which may be referred to as memory cells or elements, arranged in an array of columns and rows. By measuring the current through each cell, the resistance of each cell, and thus the data stored in the memory array can be read.

In some embodiments, the free magnetic region and the fixed magnetic region may each include a plurality of the layer(s) of magnetic or ferromagnetic materials, For example, materials that include one or more of the ferromagnetic elements nickel (Ni), iron (Fe), and cobalt (Co), including, for example, alloys or engineered materials with one or more of the elements palladium (Pd), platinum (Pt), magnesium (Mg), manganese (Mn), and chromium (Cr), boron (B) as well as one or more synthetic antiferromagnetic structures (SAF) or synthetic ferromagnetic structures (SyF) wherein one or more layers of magnetic materials layers may also include one or more non-magnetic materials layers (for example, ruthenium (Ru), copper (Cu), aluminum (Al), tantalum (Ta), titanium (Ti), niobium (Nb), vanadium (V), zirconium (Zr), iridium (Ir) and one or more alloys thereof, and in certain embodiments, tungsten (W) and molybdenum (Mo). An intermediate layer (e.g., a dielectric layer) may be, for example, one or more layers of aluminum oxide and/or magnesium oxide.

In a magnetoresistive device utilizing SOT switching mechanics, switching the magnetization of the free region of a magnetoresistive stack may be accomplished, or assisted, by driving a charge current pulse through a spin-Hall (SH) material proximate (e.g., in contact with or near) the free region. Examples of SH materials include, but are not limited to, platinum (Pt), beta-tungsten (β-W), tantalum (Ta), palladium (Pd), hafnium (Hf), gold (Au), alloys including gold (e.g., AuPt, AuCu, AuW), alloys including bismuth (Bi) and selenium (Se) (e.g., $Bi_2Se_3$ or $(BiSe)_2Te_3$), alloys including copper (Cu) and one or more of platinum (Pt), bismuth (Bi), iridium (Ir), or lead (Pb) (e.g., CuPt alloys, CuBi alloys, CuIr alloys, CuPb alloys), alloys including silver (Ag) and bismuth (Bi) (e.g., AgBi alloys), alloys including manganese (Mn) and one or more of platinum (Pt), iridium (Ir), palladium (Pd), or iron (Fe) (e.g., PtMn alloys, IrMn alloys, PdMn alloys, FeMn alloys), or combinations thereof. SH material may have a positive spin Hall angle or a negative spin Hall angle.

The mean current required to be passed through a SH material in SOT switching or through a free region in STT switching in order to change its magnetic state may be referred to as the critical current ($I_C$). The critical current is indicative of the current required to "write" data in a magnetoresistive memory cell. Reducing the critical current is desirable so that, among other things, a smaller access transistor can be used for each memory cell and that a higher density, lower cost memory can be produced. A reduced critical current may also lead to greater longevity and/or durability of a magnetoresistive memory cell.

Embodiments described herein may utilize what may be referred to as spin-orbit torque (SOT) to switch or aid in switching the magnetic state of the free region in an MTJ or MTJ-like device. One of major mechanisms of SOT is that a charge (e.g., current or charge current) through an SH material adjacent to (and/or in contact with) the free region results in a spin torque acting on the free region due to the injection of a spin current into the free region from the spin-dependent scattering of electrons and/or spin-orbit interaction in the SH material. The polarity of the charge current through the SH material and the polarity of the spin Hall angle in the SH material may determine the direction in which the spin current is imparted. The spin current may be injected into the free region in a direction perpendicular to the boundary (or interface) where the free region and the SH material meet, and orthogonal to the direction of the charge current flow. The spin torque applied to the free region by the spin current impacts the magnetic state of the free region in a manner similar to spin-polarized tunneling current that flows through the MTJ in traditional STT magnetic tunnel junctions. As the function of STT magnetic tunnel junctions is well known in the art, it will not be further described here.

Other mechanisms for inducing spin-orbit torque include charge current flowing parallel to an interface between the free region and the SH material with broken inversion symmetry (e.g., an interface without an axis of rotational symmetry). The flowing electrons may become spin polarized at the interface due to spin-orbit coupling. The spin polarized electrons may exert a torque on the magnetization of the adjacent free region.

As with write currents in conventional STT MTJ devices, in devices using SOT switching mechanisms, the direction of SOT is dependent on the direction of the charge current flow in the SH material. In other words, the direction of charge current flow within the SH material proximate to the free region determines the direction of torque that is applied to the free region. Accordingly, the free region may be able to be switched between two stable states based on torque applied by charge current flowing in the proximate SH material in one of two directions. In some embodiments, the free region may be able to be switched between two stable magnetic states based on the torque applied by a STT current flowing in either direction through the MTJ. The magnetic state of the free region may also be switched by the torque resulting from both an STT current by applying an electrical current through MTJ bit and SOT from one or more SH materials by applying a charge current through one or more SH materials.

Two of the mechanisms of SOT: spin Hall effect and interfacial SOT effect, may compete or aggregate, resulting in varying magnetoresistive properties. At a given direction of charge current through SH material, the polarity of torque direction by spin Hall effect may be determined by bulk material properties of SH materials (e.g., positive or negative spin Hall angle). The polarity of torque direction by interfacial SOT effect may determined by interfacial physical and chemical state between the SH material and the free region as well as bulk material properties of SH materials. To promote high switching efficiency, it may be desirable that the two mechanisms have the same polarity, strengthening each other and aggregating to result in an increased switching efficiency. Components of spin torque, damping-like torque and field-like torque, are generally orthogonal to each other. In some embodiments, the damping-like torque direction of interfacial SOT effect may be aligned with the damping-like torque direction of spin Hall effect, resulting in an increased switching efficiency. In some examples, the polarity of torque direction by interfacial SOT effect can be opposite from the polarity of torque direction by spin Hall effect, and which may result in the switching efficiency deteriorating.

In some cases, interfacial spin-orbit coupling increases spin memory loss of the spin current generated by spin Hall effect, resulting in a deteriorating switching efficiency. In such cases, it may be effective to alter the interfacial physical and chemical state by insertion of metal layer or oxide layer (e.g., a layer including a nitride) between the SH material and the free region to improve the switching efficiency. The insertion of metal layer or oxide layer may suppress the interfacial spin-orbit coupling or the interfacial SOT effect. The insertion of metal layer or oxide layer, combined with careful tuning of the oxidation state of the oxide layer may change the polarity of torque direction by interfacial SOT effect, effectively aligning it with the polarity of torque direction by spin Hall effect.

In some embodiments, the torque applied by SOT alone is used to switch the free region, whereas in other embodiments, SOT is an "assist" to reduce the magnitude of an STT write current required to switch the magnetic state of the free region. In embodiments, where the STT write current travels through the entirety of the MTJ stack to produce a spin polarized tunneling current between the free region and fixed region. Reading of data stored by the MTJ stack is accomplished as in a conventional STT MTJ device. For example, a read current, having a magnitude less than that of the critical current of the MTJ stack, is applied to the MTJ stack to sense the resistance of the MTJ stack. As a person of ordinary skill in the art would recognize, there are many techniques that may be used to detect or sense the resistance of the MTJ stack. In some embodiments, the resistance sensed based on the read current can be compared with a reference resistance to determine the state of the free region. In some embodiments, a self-referenced read operation is performed where the resistance through the MTJ is sensed, then the MTJ is written (or reset) so that the free region is in a known state, then the resistance is sensed again and compared with the resistance originally sense. The original state of the free region can then be determined based on whether the resistance sense has changed based on the write or reset operation. In still other embodiments, a mid-point reference read operation may be performed.

For the sake of brevity, conventional techniques related to semiconductor processing may not be described in detail herein. The exemplary embodiments may be fabricated using known lithographic processes. The fabrication of integrated circuits, microelectronic devices, micro electric mechanical devices, microfluidic devices, and photonic devices involves the creation of several layers or regions (e.g., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of the developer. An etch may then be employed/applied whereby the layer (or material) not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack having one or more electrically conductive electrodes, vias, or conductors on either side of a magnetic material stack. As described in further detail below, the magnetic material stack may include many different regions of material, where some of these regions include magnetic materials, whereas others do not. In one embodiment, the methods of manufacturing include sequentially depositing, growing, sputtering, evaporating, and/or providing (which may be referred to collectively herein as "depositing") regions which after further processing (e.g., etching) form a magnetoresistive stack.

In some embodiments, the disclosed magnetoresistive stacks may be formed between a top electrode/via/line and a bottom electrode/via/line and which permit access to the stack by allowing for connectivity (e.g., electrical) to circuitry and other elements of the magnetoresistive device. Between the electrodes/vias/lines are multiple regions, including at least one fixed magnetic region (which may be referred to hereinafter as a fixed region) and at least one free magnetic region (which may be referred to hereinafter as a free region) with one or more intermediate layers (e.g., a dielectric layer) that forms a tunnel barrier between the fixed region and the free region. Each of the fixed region and the free region may include, among other things, a plurality of ferromagnetic layers. In some embodiments, the fixed region (e.g., fixed region 160 discussed below) may include a synthetic antiferromagnet (SAF). In some embodiments, a top electrode (and/or) bottom electrode may be eliminated and a bit line and/or SH material may be formed on top of the stack. Additionally, each magnetoresistive stack may be disposed proximate to an SH material. The SH material may be configured to carry charge current and impart spin current on the free region during write and reset operations. In one or more embodiments, one or more electrodes of a magnetoresistive stack may include an SH material. In other embodiments, a magnetoresistive stack may be formed between a top electrode and a bottom electrode and proximate to an SH material, the SH material being independently connected to a charge current source. In such embodiments, the magnetoresistive stack or device may be referred to as a three-terminal magnetoresistive device.

Referring now to FIGS. 1A-6B, various magnetoresistive stacks (e.g., the relative location and orientation of the free region, the intermediate layer, the fixed region, one or more SH materials, and/or one or more other layers or regions) are shown. The simplified illustrations in FIGS. 1A-6B do not necessarily show all regions and layers of an exemplary magnetoresistive stack, but instead are intended to illustrate the relative location and positioning of several exemplary regions. Further, although the regions depicted in FIGS. 1A-6B are rectangular in shape, this is for simplicity and clarity only. The magnetoresistive stacks described herein may have a rectangular, trapezoidal, pyramidal, cylindrical, or other shape.

Referring now to FIGS. 1A-1C, a magnetoresistive device 100, 101, 102 may include one or more regions or layers between a line, strip, or region of SH material 110 and a top electrode 180. For example, referring to FIG. 1A, a free region 120, may be disposed on and in contact with SH material 110. An intermediate layer 130 may be disposed on and in contact with free region 120. A fixed region 160 may be disposed on the other side of intermediate layer 130 from free region 120. In some embodiments, fixed region 160 may be disposed on and in contact with intermediate layer 130. The magnetoresistive device 100, may include one or more additional regions or layers, such as, for example, a cap region 170. Cap region 170 may be disposed above and in contact with fixed region 160. Top electrode 180 may be disposed above fixed region 160, such as, for example, disposed above and in contact with cap region 170.

Referring to FIG. 1B, magnetoresistive device 101 may include a metal insertion layer 210 disposed between SH material 110 and free region 120. The metal insertion layer 210 may include one or more layers of metal or metal alloys such as hafnium (Hf), chromium (Cr), platinum (Pt), tantalum (Ta), iridium (Ir), ruthenium (Ru), tungsten (W), or alloys and combinations thereof. Metal insertion layer 210 may have a thickness less than or equal to approximately 2 nanometers (nm), such as for example, less than or equal to approximately 1.5 nm, less than or equal to approximately 1 nm, approximately 1 nm to approximately 2 nm, approximately 1 nm to approximately 1.5 nm, approximately 0.5 nm to approximately 1.5 nm, approximately 0.5 nm to approximately 1.0 nm, approximately 0.7 nm, approximately 0.5 nm, or any other suitable thickness that does not deleteriously affect the transfer of spin current from SH material 110 to free region 120. Without being limited by theory, inclusion of metal insertion layer 210 may reduce spin memory loss at an interface of SH material 110 and free region 120 (e.g., the interface of SH material 110 and free region 120 shown in FIG. 1A). This spin memory loss may be caused by the interfacial spin-orbit coupling, and the inclusion of metal insertion layer 210 may improve switching efficiency of SOT operations by reducing interfacial spin-orbit coupling.

Referring to FIG. 1C, magnetoresistive device 102 may include an oxide insertion layer 310 disposed between SH material 110 and free region 120. The term "oxide" insertion layer is meant to be explanatory and not descriptive. Although oxide insertion layer 310 may include one or more oxides (such as, for example, copper oxide (CuOx), gadolinium oxide (GdOx), magnesium oxide (MgOx), hafnium oxide (HfOx), titanium oxide (TiOx), ruthenium oxide (RuOx), rhenium oxide (ReOx), iridium oxide (IrOx)), in addition or alternatively, oxide insertion layer 310 may include one or more nitrides (e.g., TaN). Oxide insertion layer 310 may have a thickness less than or equal to approximately 2 nm, such as for example, less than or equal to approximately 1.5 nm, less than or equal to approximately 1 nm, approximately 1 nm to approximately 2 nm, approximately 1 nm to approximately 1.5 nm, approximately 0.5 nm to approximately 1.5 nm, approximately 0.5 nm to approximately 1.0 nm, approximately 0.7 nm, approximately 0.5 nm, or any other suitable thickness that does not deleteriously affect the transfer of spin current from SH material 110 to free region 120. Without being limited by theory, inclusion of oxide insertion layer 310 may control the magnitude or the polarity of torque direction of the interfacial SOT effect caused by an interface of SH material 110 and free region 120 (e.g., the interface of SH material 110 and free region 120 shown in FIG. 1A). For example, inclusion of an oxide insertion layer 310 may align the polarity of torque direction of the interfacial SOT effect with the polarity of torque direction of the spin Hall effect, so that the interfacial SOT effect contributes to the switching work imparted from SH material 110 to free region 120, instead of working against the switching work. Accordingly, inclusion of oxide insertion layer 310 may improve switching efficiency of SOT operations.

Referring again to FIGS. 1A-1C, for read operations, current may pass from SH material 110, through the magnetoresistive stack 100, 101, 102, to top electrode 180. For write and/or reset operations, current may pass along SH material 110, imparting spin current to free region 120. In addition, a write current may also be passed from SH material 110, through the magnetoresistive stack 100, 101, 102, to top electrode 180, to assist in switching the magnetic state of free region 120 (e.g., via STT).

In some embodiments, the magnetoresistive stacks of the present disclosure, specifically the free regions of the magnetoresistive stacks, may utilize a high aspect ratio (e.g., have a height greater than or equal to a width or a diameter) or may be otherwise bar-shaped or cylindrically-shaped. For example, a free region may have an aspect ratio of greater than or equal to approximately 1.0, greater than equal to approximately 1.5, greater than or equal to approximately 2.0, approximately 1.5 to 2.0.

Referring to FIGS. 2A-2B, a magnetoresistive device 100 may include an intermediate layer 130 disposed above and in contact with a fixed region 160. A free region 120 may be provided above and in contact with the intermediate layer 130, opposite the fixed region 160. In some embodiments, an SH material 110 may be disposed adjacent to and in contact with the free region 120. That is, the SH material 110 may be in contact with only the free region 120, and not with the intermediate layer 130 or the fixed region 160. In some embodiments, the SH material 110 may extend along a width of the free region 120. In other embodiments, the SH material 110 may extend only partially along a width of the free region 120. In some embodiments, the SH material 110 may contact a top edge of the free region 120 and/or a bottom edge of the free region 120. The SH material 110 may have a height less than or equal to the height of free region 120. As alluded to above, the SH material 110 may not touch the fixed region 160. Contact of the SH material 110 to the fixed region 160 may result in a shorting of the MTJ, which inhibits the ability of the magnetoresistive stack to store data and/or read out data. In some embodiments, when a charge current flows through SH material 110 (for example, as depicted by the arrows in FIGS. 2A and 2B), the SH material 110 may impart a spin current to free region 120 in a direction perpendicular to the interface of the SH material 110 and free region 120, and orthogonal to the direction of charge current flow.

In one or more embodiments, the SH material 110 may radially cover 60°-300° of free region 120 in a plane perpendicular to the interface of the SH material 110 and free region 120. In some embodiments, a larger cover angle may result in a higher switching efficiency. For example, the critical current $I_C$ of spin-orbit torque may be represented according to Equation 1, shown below:

$$I_c = \frac{4e\alpha}{\hbar\theta_{SH}} \frac{A_H}{A_F} E_b$$

where $A_F$ represents contact area between the free region and the SH material, $A_H$ represents cross-sectional area of the SH material, $E_b$ represents energy barrier of the free region for data retention, α represents Gilbert damping constant of the free region, e represents elementary charge, represents reduced Planck constant, and $\theta_{SH}$ represents effective spin Hall angle of the SH material. As the contact area between the free region and the SH material, $A_F$, is increased, the critical current $I_C$ is lowered. In addition to the advantageous effects of lowering critical current $I_C$ described above, the switching efficiency is also increased.

In some embodiments, portions of the SH material 110 may extend past an edge of barrier 135, 135' and further extend at approximately a 90° angle laterally outwards away from free region 120, to connect to a source line through a select transistor or to the next bit. In such embodiments, SH material 110 may have two or more dimensions greater than one or more of barrier 135, 135' or free region 120. In one or more embodiments, portions of SH material 110 may have a thickness sufficient to impart a spin current to free region 120 with enough magnitude to change the magnetic state of free region 120. In some embodiments, the source line may be connected to one or more portions of the SH material 110 extending laterally away from free region 120, forming a three-terminal device (e.g., a first terminal connected to the SH material 110, a second terminal connected to the other end of the SH material 110, and a third terminal connected to a bottom electrode). For simplicity, other parts of magnetoresistive devices 100, 101, 102 described in relation to FIGS. 1A-1C (e.g., bottom electrode, top electrode, cap layer) are not shown in FIGS. 2A-6B. It should be understood that one or more of these parts may be incorporated into the embodiments described in relation to FIGS. 2A-6B.

Still referring to FIGS. 2A and 2B, in some embodiments, a barrier 135 may be disposed between the free region 120 and the SH material 110. The barrier 135 may be in contact with both the free region 120 and the SH material 110. In some embodiments, the SH material 110 does not contact the free region 120. As described previously, SH material 110 may extend along a width of the free region 120 or the SH material 110 may extend only partially along a width of the free region 120. The barrier 135 may have a width greater than or equal to SH material 110. In some embodiments, barrier 135 may have a height greater than or equal to SH material 110. Barrier 135 may extend from the top edge of free region 120. In some embodiments, barrier 135 does not extend past the bottom edge of free region 120. In other embodiments, barrier 135 may extend from the top edge of free region 120 to the bottom edge of fixed region 160. In still other embodiments, barrier 135 may extend from a position adjacent to (and in contact with) free region 120 to a position adjacent to (and in contact with) fixed region 160. In one or more embodiments, barrier 135 (and indirectly SH material 110) may radially cover 30°-200° of free region 120 in a plane perpendicular to the interface of barrier 135 and free region 120. SH material 110, although only in contact with a portion of the width of free region 120, may radially cover more of free region 120, in a plane perpendicular to the interface of barrier 135 and free region 120, than barrier 135.

Barrier 135 may comprise one or more oxides and/or nitrides. For example, barrier 135 may include one or more metal oxides (e.g., aluminum oxide, magnesium oxide, hafnium oxide, silicon oxide, ruthenium oxide, rhenium oxide, copper oxide, gadolinium oxide, or titanium oxide), one or more metalloid conductors (e.g., silicon, germanium, or antimony), and/or metal nitrides (e.g., tantalum nitride or silicon nitride). Inclusion of barrier 135 may prevent a sneak charge current from flowing through the free region 120, from SH material 110. The composition of barrier 135 may be selected such that the barrier 135 relatively transmits a spin current well, but it does not transmit a charge current well.

In some embodiments, such as the ones shown in FIGS. 2A-2B, a magnetoresistive stack includes two barriers 135, 135', disposed on opposing sides of free region 120. Each barrier 135, 135' may be in contact with both the free region 120 and SH material 110. As described previously, SH material 110 may extend along a width of the free region 120 or the SH materials 110 may extend only partially along a width of the free region 120. The one or more barriers 135, 135' may have a width greater than or equal to a width of the SH material 110 with which they are in contact. In some embodiments, barrier 135 may have a height greater than or equal to a height of the SH material 110 with which they contact. In some embodiments, when charge (e.g., current) flows through the SH material horizontally, the SH material 110 may impart a spin current to free region 120 in a direction perpendicular to the interface between free region 120 and SH material 110, and orthogonal to the direction of charge (e.g., current) flow. The charge (e.g., current) may also impart a spin current to free region 120 in a direction perpendicular to the interface between the free region 120 and the barrier 135, 135'.

Referring to FIGS. 3A and 3B, a magnetoresistive device 101 may include an intermediate layer 130 disposed above and in contact with a fixed region 160. A free region 120 may be above and in contact with the intermediate layer 130, opposite the fixed region 160. As previously described, SH material 110 may be placed adjacent to and in contact with free region 120 and the magnetoresistive device may include one or more barriers 135, 135'. In some embodiments, magnetoresistive device 101 may include one or more metal insertion layers 210, 210' disposed between free region 120 and SH material 110 (e.g., between one or more barriers 135, 135' and SH material 110). Metal insertion layer 210, 210' may have a composition and structure (e.g., thickness) as described above. Metal insertion layer 210, 210' may have a width greater than or equal to SH material 110 and/or barrier 135, 135'. In some embodiments, metal insertion layer 210, 210' may have a height greater than or equal to SH material 110 and/or barrier 135, 135'. Metal insertion layer 210, 210' may extend from the top edge of free region 120. In some embodiments, metal insertion layer 210, 210' does not extend past the bottom edge of free region 120. The metal insertion layer 210, 210' may not touch the fixed region 160. Contact of the metal insertion layer 210, 210' to the fixed region 160 may result in a shorting of the MTJ, which inhibits the ability of the magnetoresistive stack to read out stored data. In one or more embodiments, barrier 135 (and indirectly metal insertion layer 210, 210') may radially cover 30°-200° of free region 120 in a plane perpendicular to the interface of barrier 135 and free region 120. SH material 110, although only in contact with a portion of the width of free region 120, may radially cover more of free region 120, in a plane perpendicular to the interface of barrier 135 and free region 120, than metal insertion layer 210, 210'. The metal insertion layer 210, 210' may reduce the interfacial SOT effect of whose polarity is not favorable to switching at the barrier area, and then improve the switching efficiency.

In some embodiments, such as the ones shown in FIGS. 3A-3B, a magnetoresistive stack includes two metal insertion layers 210, 210', disposed on opposing sides of free region 120. Each metal insertion layer 210, 210' may be in contact with both the barrier 135, 135' and SH material 110. As described previously, SH material 110 may extend along a width of the metal insertion layer 210, 210' or the SH materials 110 may extend only partially along a width of the metal insertion layer 210, 210'.

Referring to FIGS. 4A and 4B, a magnetoresistive device 101 may include an intermediate layer 130 disposed above and in contact with a fixed region 160. A free region 120 may be above and in contact with the intermediate layer 130, opposite the fixed region 160. In some embodiments, one or more barriers 135, 135' may be disposed between the free region 120 and the SH material 110. In some embodiments, such as the ones shown in FIGS. 4A-4B, a magnetoresistive stack includes two barriers 135, 135', disposed on opposing sides of free region 120. Each barrier 135, 135' may be in contact with both the free region 120 and metal insertion layer 210, but not SH material 110. In some embodiments, SH material 110 does not contact the free region 120. As alluded to above, metal insertion layer 210 may isolate SH material 110 from free region 120.

As described previously, metal insertion layer 210 may extend along a width of the free region 120. In one or more embodiments, metal insertion layer 210 (directly or indirectly through barrier 135, 135') may radially cover 30°-300° of free region 120 in a plane perpendicular to the interface of barrier 135, 135' and free region 120. In some embodiments, when electrons flow through the SH material, SH material 110 may impart a spin current by the spin Hall effect, through metal insertion layer 210, to free region 120, in a direction perpendicular to the interface between free region 120 and barrier 135, 135' and to the interface between free region 120 and metal insertion layer 210, and orthogonal to the direction of electron flow.

Referring to FIGS. 5A and 5B, a magnetoresistive device 102 may include an intermediate layer 130 disposed above and in contact with a fixed region 160. A free region 120 may be above and in contact with the intermediate layer 130, opposite the fixed region 160. As previously described, SH material 110 may be placed adjacent to and in contact with free region 120 and the magnetoresistive device may include one or more barriers 135, 135'. In some embodiments, magnetoresistive device 102 may include one or more oxide insertion layers 310, 310' disposed between free region 120 and SH material 110 (e.g., between one or more barriers 135, 135' and SH material 110). Oxide insertion layer 310, 310' may have a composition and structure (e.g., thickness) as described above. In some embodiments, oxide insertion layer 310, 310' may have the same composition as an adjoining barrier 135, 135'. Oxide insertion layer 310, 310' may have a width greater than or equal to SH material 110 and/or barrier 135, 135'. In some embodiments, oxide insertion layer 310, 310' may have a height greater than or equal to SH material 110 and/or barrier 135, 135'. Oxide insertion layer 310, 310' may extend from the top edge of free region 120. In some embodiments, oxide insertion layer 310, 310' does not extend past the bottom edge of free region 120. In other embodiments, oxide insertion layer 310, 310' may extend from the top edge of free region 120 to the bottom edge of fixed region 160. In one or more embodiments, barrier 135 (and indirectly oxide insertion layer 310, 310') may radially cover 30°-200° of free region 120 in a plane perpendicular to the interface of barrier 135 and free region 120. SH material 110, although only in contact with a portion of the width of free region 120, may radially cover more of free region 120, in a plane perpendicular to the interface of barrier 135 and free region 120, than oxide insertion layer 310, 310'.

In some embodiments, such as those shown in FIGS. 5A-5B, a magnetoresistive stack 102 includes two oxide insertion layers 310, 310', disposed on opposing sides of free region 120. Each oxide insertion layer 310, 310' may be in contact with both the barrier 135, 135' and SH material 110. As described previously, SH material 110 may extend along a width of the oxide insertion layer 310, 310' or the SH materials 110 may extend only partially along a width of the oxide insertion layer 310, 310'.

Referring to FIGS. 6A and 6B, a magnetoresistive stack 102 may include an intermediate layer 130 disposed above and in contact with a fixed region 160. A free region 120 may be above and in contact with the intermediate layer 130, opposite the fixed region 160. In some embodiments, one or more barriers 135, 135' may be disposed between the free region 120 and the SH material 110.

In some embodiments, such as the ones shown in FIGS. 6A-6B, a magnetoresistive stack includes two barriers 135, 135', disposed on opposing sides of free region 120. Each barrier 135, 135' may be in contact with both the free region 120 and oxide insertion layer 310, but not SH material 110. In some embodiments, SH material 110 does not contact the free region 120. As alluded to above, oxide insertion layer 310 may isolate SH material 110 from free region 120.

As described previously, oxide insertion layer 310 may extend along a width of the free region 120. In one or more embodiments, oxide insertion layer 310 (directly or indirectly through barrier 135, 135') may radially cover 30°-300° of free region 120 in a plane perpendicular to the interface of barrier 135, 135' and free region 120. In some embodiments, the alignment of the interfacial SOT effects at different interfaces and the spin Hall effect may be accomplished by positioning oxide insertion layers 310 such that the oxidation states of some interfaces between SH material 110 and free region 120 vary depending on whether that surface of free region 120 contacts the oxide insertion layer 310 or barrier 135, 135'. The oxidation states of one or more surfaces of SH material 110 may be tailored to adjust the polarity of the interfacial SOT effect dependent interfacial physical and chemical states.

An exemplary method of manufacturing a magnetoresistive stack with SOT switching (e.g., a magnetoresistive stack including one of the geometries discussed above) will now be discussed with reference to FIGS. 1A-6B. It should be understood that although the exemplary method is discussed in the context of one specific switching geometry (e.g., orientation, location, and positioning of one or more of free region 120, fixed region 160, intermediate region 130, SH material 110, one or more barriers 135, 135', one or more metal insertion layers 210, 210', or one or more oxide insertion layers 310, 310'), the techniques, methods, and principles described herein are applicable to any of the described switching geometry embodiments. Further, aspects or features of one or more exemplary methods may be combined with aspects or features of any other described exemplary method. Additionally, as previously stated, commonly performed conventional techniques related to semiconductor processing may not be specifically described herein. Rather, the description herein is intended to highlight aspects of example methods of manufacturing a magnetoresistive stack utilizing STT and/or SOT switching.

Figure 7A:
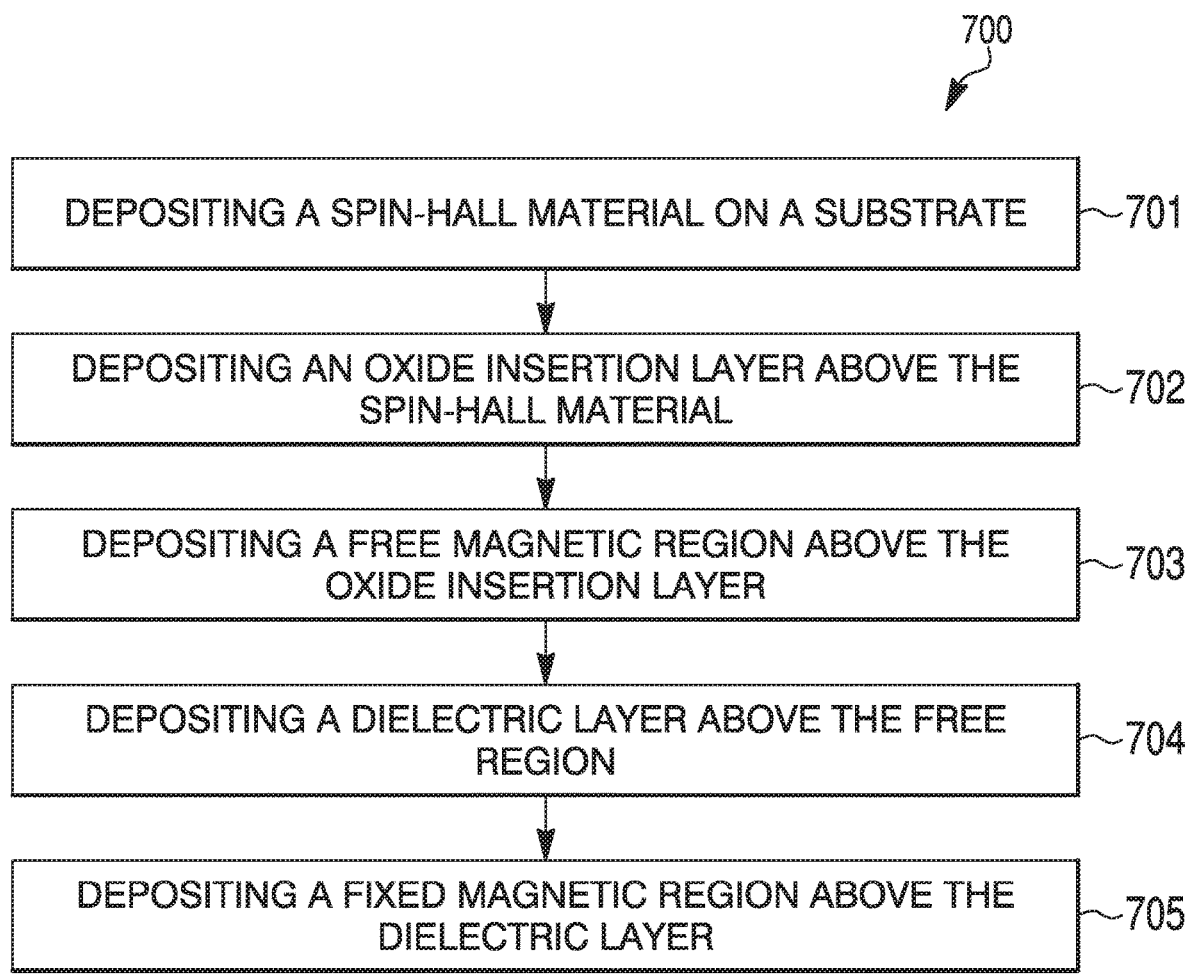

FIG. 7A is a flow chart of a method 700 of manufacturing a magnetoresistive stack 102 utilizing STT and/or SOT switching and including at least one oxide insertion layer 310, according to one or more embodiments of the present disclosure. The method 700 may include depositing a spin-Hall (SH) material 110 on a substrate (step 701). The method 700 may further include depositing an oxide insertion layer 310 above the SH material 110 (step 702). In some embodiments, the method 700 may include depositing a free magnetic region 120 above the oxide insertion layer 310 (step 703). The method 700 may further include depositing an intermediate layer 130 (e.g., a dielectric layer) above the free region 120 (step 704). In some embodiments, the method 700 may include depositing a fixed magnetic region 160 above the intermediate layer 130 (e.g., a dielectric layer) (step 705).

Figure 7B:
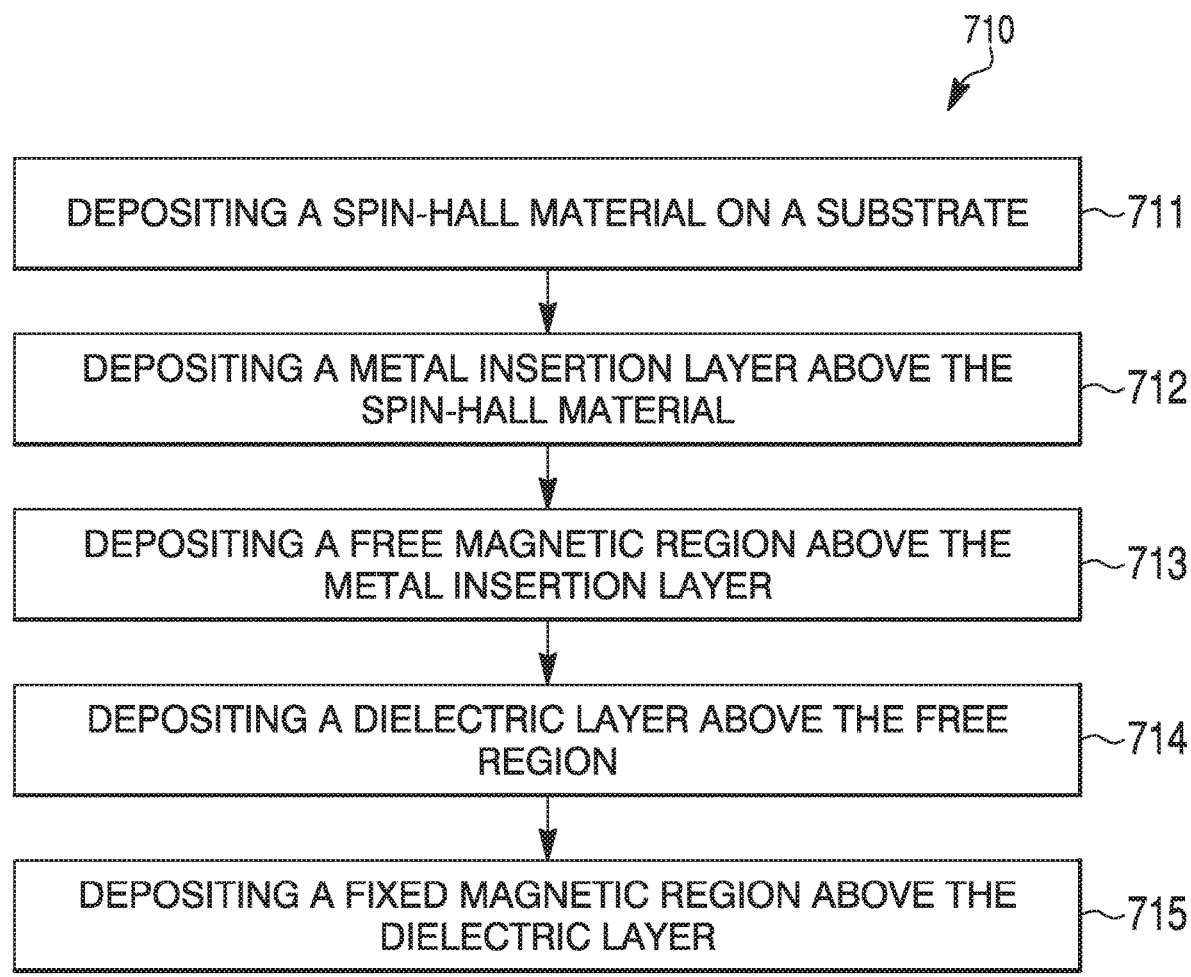

FIG. 7B is a flow chart of a method 700 of manufacturing a magnetoresistive stack 101 utilizing STT and/or SOT switching and including at least one metal insertion layer 210, according to one or more embodiments of the present disclosure. The method 710 may include depositing a spin-Hall (SH) material 110 on a substrate (step 711). The method 710 may further include depositing a metal insertion layer 210 above the SH material 110 (step 712). In some embodiments, the method 710 may include depositing a free magnetic region 120 above the metal insertion layer 210 (step 713). The method 710 may further include depositing an intermediate layer 130 (e.g., a dielectric layer) above the free region 120 (step 714). In some embodiments, the method 700 may include depositing a fixed magnetic region 160 above the intermediate layer 130 (e.g., a dielectric layer) (step 715).

Figure 7C:
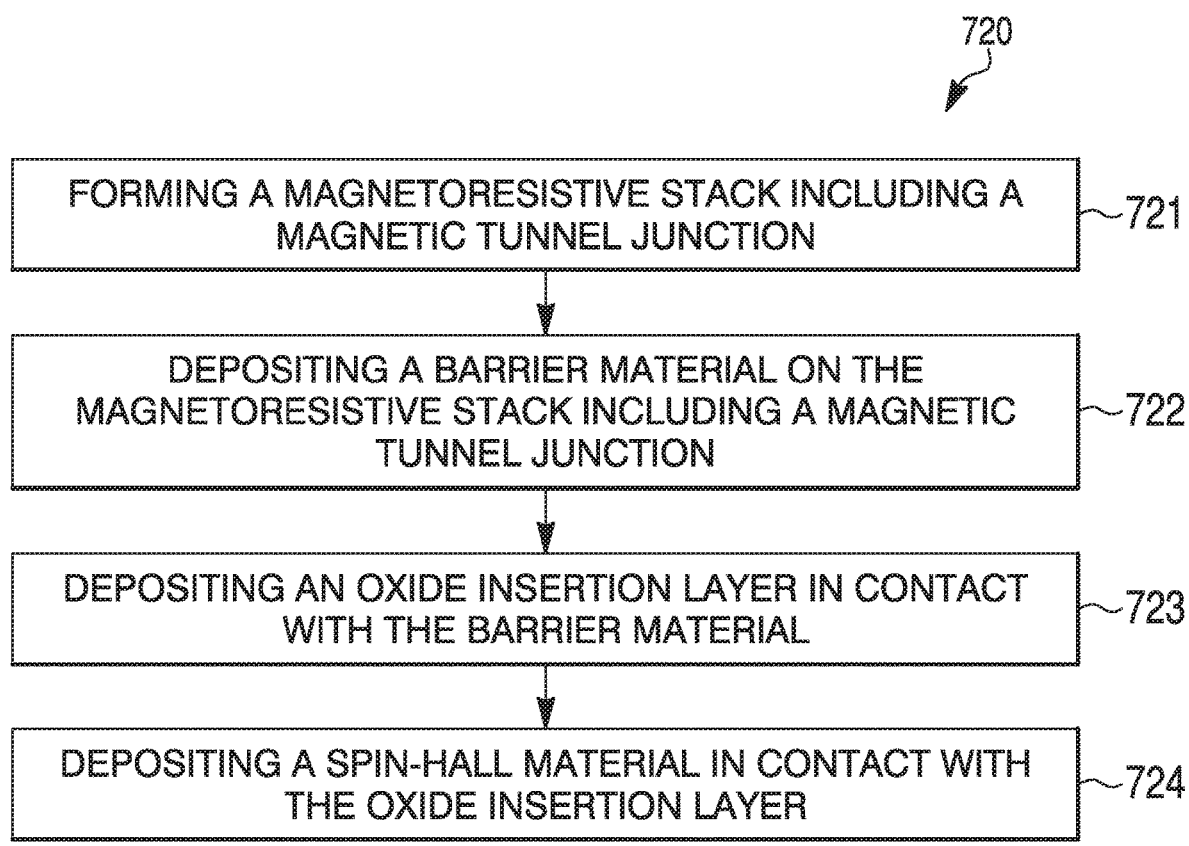

FIG. 7C is a flow chart of a method 720 of manufacturing a magnetoresistive stack 102 utilizing STT and/or SOT switching and including at least one oxide insertion layer 310, according to one or more embodiments of the present disclosure. The method 720 may include forming a magnetoresistive stack including a magnetic tunnel junction (step 721). The method 720 may further include depositing a barrier 135 material on the magnetoresistive stack including a magnetic tunnel junction (step 722). In some embodiments, the method 720 may include depositing an oxide insertion layer 310 in contact with barrier 135 material (step 723). The method 720 may further include depositing a spin-Hall (SH) material 110 in contact with the oxide insertion layer 310 (step 724).

Figure 7D:
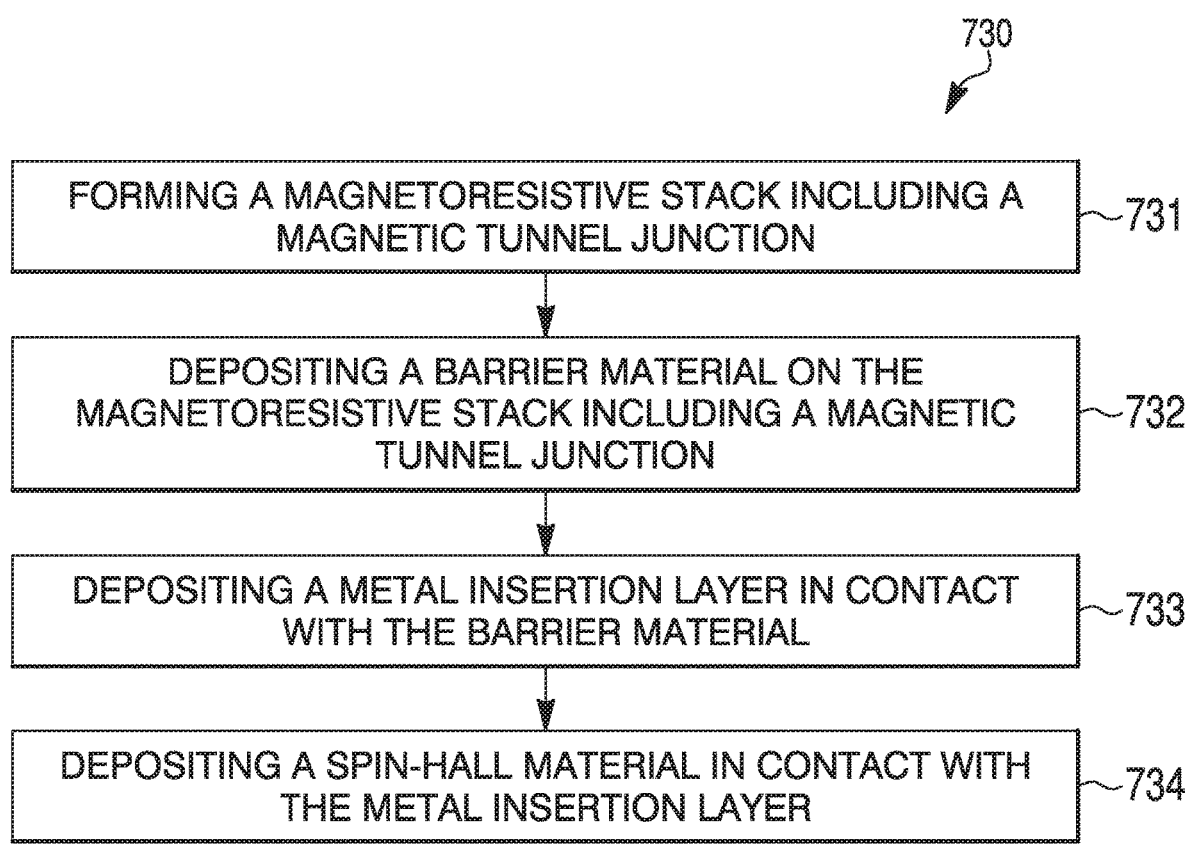

FIG. 7D is a flow chart of a method 730 of manufacturing a magnetoresistive stack 101 utilizing STT and/or SOT switching and including at least one metal insertion layer 210, according to one or more embodiments of the present disclosure. The method 730 may include forming a magnetoresistive stack including a magnetic tunnel junction (step 731). The method 730 may further include depositing a barrier 135 material on the magnetoresistive stack including a magnetic tunnel junction (step 732). In some embodiments, the method 730 may include depositing a metal insertion layer 210 in contact with barrier 135 material (step 733). The method 730 may further include depositing a spin-Hall (SH) material 110 in contact with the metal insertion layer 210 (step 734).

As alluded to above, the magnetoresistive devices of the present disclosure, including one or more switching geometries described herein, may be implemented in a sensor architecture or a memory architecture (among other architectures). For example, in an MTJ device having a memory configuration, the MTJs may be electrically connected to an access transistor and configured to couple or connect to various conductors, which may carry one or more control signals, as shown in FIG. 8. The magnetoresistive devices of the current disclosure may be used in any suitable application, including, e.g., in a memory configuration. In such instances, the magnetoresistive devices may be formed as an integrated circuit comprising a discrete memory device (e.g., as shown in FIG. 9) or an embedded memory device having a logic therein (e.g., as shown in FIG. 10), each including MRAM, which, in one embodiment is representative of one or more arrays of MRAM having a plurality of magnetoresistive devices 100, 101, 102, according to certain aspects of certain embodiments disclosed herein.

In one embodiments, a magnetoresistive device is disclosed. The device includes a top electrode, a magnetically fixed region, a magnetically free region positioned above or below the magnetically fixed region, and an intermediate region (e.g., a dielectric layer) positioned between the magnetically fixed region and the magnetically free region. The free region may be configured to have a first magnetic state and a second magnetic state. The magnetoresistive device may also include a spin Hall material proximate to at least a portion of the free region and an insertion layer disposed between the SH material and the free region, wherein the insertion layer comprises an oxide or a metal.

Various embodiments of the disclosed magnetoresistive device may additionally or alternatively also include one or more of the following features: the SH material may comprise at least one of platinum, beta-tungsten, palladium, hafnium, gold, an alloy including gold, and alloy including bismuth and selenium, an alloy including copper, an alloy including manganese, iridium, selenium, or one or more combinations thereof; charge current through the SH material may generate spin current in a direction perpendicular to a plane between the SH material and the free region; the insertion layer may have a thickness less than or equal to approximately 2.0 nm; the magnetoresistive device may be configured such that charge current may pass through SH material without passing through free region or charge current may pass through the free region without passing through the SH material; the SH material may extend across an entire width of the insertion layer; and/or the fixed region may comprise a synthetic antiferromagnet.

In another embodiment, a magnetoresistive device is disclosed. The magnetoresistive device may include a magnetically fixed region, a magnetically free region positioned above or below the magnetically fixed region, and an intermediate region (e.g., a dielectric layer) positioned between the magnetically fixed region and the magnetically free region. The free region may be configured to have a first magnetic state and a second magnetic state. A barrier may be proximate to at least a portion of the free region. A spin Hall material may be proximate to at least a portion of the magnetically free region. A current though the SH material may generate spin current in a direction perpendicular to a plane between the SH material and the free region. The device may include a metal insertion layer disposed between the SH material and the barrier.

Various embodiments of the disclosed magnetoresistive device may additionally or alternatively also include one or more of the following features: the metal insertion layer may comprise hafnium, chromium, platinum, tantalum, iridium, ruthenium, tungsten, or an alloy or combination thereof; the device may be configured such that charge current may be passed through the SH material without passing through the free region; charge current flowing in a first direction though the SH material may switch the free region to the first magnetic state and charge current flowing in a second direction may switch the free region to the second magnetic state; the SH material may radially cover at least about 180° of the free region, in a plane perpendicular to the interface of the SH material and the free region; SH material covering a first radial portion of the free region may have a thickness greater than the SH material covering a second radial portion of the free region; and/or the metal insertion layer may have a thickness less than or equal to 2.0 nm.

In another embodiment, a magnetoresistive device is disclosed. The magnetoresistive device may include a magnetically fixed region, a magnetically free region positioned above or below the magnetically fixed region, and an intermediate region (e.g., a dielectric layer) positioned between the magnetically fixed region and the magnetically free region. The free region may be configured to have a first magnetic state and a second magnetic state. A barrier may be proximate to at least a portion of the free region. A spin Hall material may be proximate to at least a portion of the magnetically free region. A charge current though the SH material may generate spin current in a direction perpendicular to a plane between the SH material and the free region. The device may include an oxide insertion layer disposed between the SH material and the barrier.

Various embodiments of the disclosed magnetoresistive device may additionally or alternatively include one or more of the following features: the oxide insertion layer may comprise one or more of: copper oxide, gadolinium oxide, magnesium oxide, hafnium oxide, titanium oxide, ruthenium oxide, iridium oxide, rhenium oxide, or tantalum nitride; the free region may have an aspect ratio greater than or equal to approximately 1.0; the SH material may contact the free region; the SH material may cover about 60° to about 300° of the free region, in a plane perpendicular to an interface of the SH material and the free region; the SH material may comprise at least one of platinum, palladium, gold, beta-tungsten, tantalum, hafnium, an alloy including bismuth and selenium, CuIr alloy, CuPt alloy, CuBi alloy, CuPb alloy, an alloy including silver and bismuth, or one or more combinations thereof.

Although various embodiments of the present disclosure have been illustrated and described in detail, it will be readily apparent to those skilled in the art that various modifications may be made without departing from the present disclosure.

What is claimed is:

1. A magnetoresistive device comprising:
   a top electrode;
   a fixed region below the top electrode, the fixed region having a fixed magnetic state;
   a free region below the fixed region, wherein the free region is configured to have a first magnetic state and a second magnetic state;
   a dielectric layer between the free region and the fixed region;
   a spin-Hall (SH) material proximate to at least a portion of the free region, wherein a charge current through the SH material generates spin current in a direction perpendicular to a plane between the SH material and the free region; and
   a metal insertion layer disposed between the SH material and the free region, wherein the metal insertion layer comprises hafnium, chromium, platinum, tantalum, iridium, ruthenium, tungsten, or an alloy or combination thereof.

2. The device of claim 1, wherein the SH material comprises at least one of platinum, beta-tungsten, tantalum, palladium, hafnium, gold, an alloy including gold, an alloy including bismuth and selenium, an alloy including copper, an alloy including manganese, iridium, selenium, or one or more combinations thereof.

3. The device of claim 1, wherein the metal insertion layer has a thickness less than or equal to approximately 2.0 nm.

4. The device of claim 1, wherein the device is configured such that charge current may be passed through the SH material without passing through free region or charge current may be passed through the free region without passing through the SH material.

5. The device of claim 1, wherein the SH material extends across an entire width of the metal insertion layer.

6. The device of claim 1, wherein the fixed region comprises a synthetic antiferromagnet.

7. A magnetoresistive device comprising:
   a fixed region having a fixed magnetic state;
   a free region configured to switch between a first magnetic state and a second magnetic state;
   a dielectric layer between the free region and the fixed region;
   a barrier proximate to at least a portion of the free region;
   a spin-Hall (SH) material proximate to at least a portion of the free region, wherein charge current through the SH material generates spin current in a direction perpendicular to a plane between the SH material and the free region; and
   a metal insertion layer disposed between the SH material and the barrier.

8. The device of claim 7, wherein the metal insertion layer comprises hafnium, chromium, platinum, tantalum, iridium, ruthenium, tungsten, or an alloy or combination thereof.

9. The device of claim 7, wherein the device is configured such that charge current may be passed through the SH material without passing through free region.

10. The device of claim 7, wherein a charge current flowing in a first direction through the SH material switches the free region to the first magnetic state, and wherein a charge current flowing in a second direction switches the free region to the second magnetic state.

11. The device of claim 7, wherein the SH material radially covers at least about 180° of the free region, in a plane perpendicular to the interface of the SH material and the free region.

12. The device of claim 7, wherein the SH material covering a first radial portion of the free region has a thickness greater than the SH material covering a second radial portion of the free region.

13. The device of claim 7, wherein the metal insertion layer has a thickness less than or equal to 2.0 nm.

14. A magnetoresistive device comprising:
a fixed region having a fixed magnetic state;
a free region configured to have a first magnetic state and a second magnetic state;
a dielectric layer between the free region and the fixed region;
a barrier proximate to at least a portion of the free region;
a spin-Hall (SH) material proximate to at least a portion of the free region, wherein charge current through the SH material generates spin current in a direction perpendicular to a plane between the SH material and the free region; and
an oxide insertion layer disposed between the SH material and the barrier.

15. The device of claim 14, wherein the oxide insertion layer comprises one or more of: copper oxide, gadolinium oxide, magnesium oxide, hafnium oxide, titanium oxide, ruthenium oxide, iridium oxide, rhenium oxide, or tantalum nitride.

16. The device of claim 14, wherein the free region has an aspect ratio greater than or equal to approximately 1.0.

17. The device of claim 14, wherein the SH material contacts the free region.

18. The device of claim 17, wherein the SH material covers about 60° to about 300° of the free region, in a plane perpendicular to an interface of the SH material and the free region.

19. The device of claim 14, wherein the SH material comprises at least one of platinum, palladium, gold, beta-tungsten, tantalum, hafnium, an alloy including bismuth and selenium, CuIr alloy, CuPt alloy, CuBi alloy, CuPb alloy, an alloy including silver and bismuth, or one or more combinations thereof.

20. The device of claim 7, wherein the metal insertion layer does not include boron.

* * * * *